United States Patent [19]
Bartko et al.

[11] 4,278,476
[45] Jul. 14, 1981

[54] METHOD OF MAKING ION IMPLANTED REVERSE-CONDUCTING THYRISTOR

[75] Inventors: John Bartko, Monroeville; Earl S. Schlegel, Plum, both of Pa.

[73] Assignee: Westinghouse Electric Corp., Pittsburgh, Pa.

[21] Appl. No.: 100,680

[22] Filed: Dec. 5, 1979

[51] Int. Cl.³ .......................................... H01L 21/265
[52] U.S. Cl. .................................... 148/1.5; 148/187; 357/38; 357/91
[58] Field of Search ................... 148/1.5, 187; 357/38, 357/91

[56] References Cited

U.S. PATENT DOCUMENTS

| 3,428,870 | 2/1969 | Davis | 317/234 |
|---|---|---|---|
| 3,995,306 | 11/1976 | André et al. | 357/38 |
| 4,009,059 | 2/1977 | Nakata | 148/187 |
| 4,038,106 | 7/1977 | Kawamoto | 148/1.5 |
| 4,046,608 | 9/1977 | Iseghen et al. | 148/188 |
| 4,049,478 | 9/1977 | Ghosh et al. | 148/187 |
| 4,080,620 | 3/1978 | Chu | 357/38 |
| 4,081,821 | 3/1978 | Cornu et al. | 357/38 |
| 4,111,720 | 9/1978 | Michel et al. | 148/1.5 |
| 4,168,990 | 9/1979 | Lenie et al. | 148/1.5 |

OTHER PUBLICATIONS

Martin F. W. Nuclear Instruments & Methods, 72 (1969) 223.

Primary Examiner—L. Dewayne Rutledge
Assistant Examiner—Upendra Roy
Attorney, Agent, or Firm—C. L. Menzemer

[57] ABSTRACT

A method for making a pnpn semiconductor reverse conducting thyristor comprises the steps of forming n-type semiconductor layers on both sides of a p-type semiconductor substrate for forming an n-type emitter layer and an n-type anode-base layer. A p-type semiconductor impurity region is formed in the n-type anode-base layer for forming a p-type anode layer. A $p^+$-type semiconductor layer is ion implanted in the p-type substrate adjacent to the n-type cathode emitter layer by irradiating it with boron atoms.

4 Claims, 11 Drawing Figures

METHOD OF MAKING ION IMPLANTED REVERSE-CONDUCTING THYRISTOR

BACKGROUND OF THE INVENTION

1. Field of the Invention

This invention relates to semiconductor devices and in particular to pnpn reverse-conducting thyristors.

2. Description of the Prior Art

Thyristor designers have attempted in the past to develop a practical method for making reverse conducting semiconductor thyristors because of their ability to combine high blocking voltage capability with low conduction and switching losses. Moreover, high frequency performance is improved since a bypass diode is not needed in many electrical circuit applications.

SUMMARY OF THE INVENTION

A method for making a semiconductor device comprises the steps of forming an n-type impurity region in a p-type semiconductor substrate and forming adjacent thereto in the p-type substrate, a p-type layer of semiconductor material having an impurity concentration greater than that of the p-type substrate.

Another embodiment of the method of the present invention further includes the step of repairing any lattice damage resulting from the ion implanting of said p-type layer of semiconductor material.

More particularly, the step of forming an n-type impurity region includes the steps of forming a first n-type impurity layer commonly referred to as a anode-base layer, and forming a second n-type impurity layer commonly referred to as a cathode. In a third embodiment of the method of the present invention, a p-type impurity region commonly referred to as an anode is formed in the n-type anode-base layer. A p+-type semiconductor layer is ion implanted in the p-type substrate adjacent to the n-type layer by irradiating the n-type emitter layer with boron atoms at a predetermined energy from a tandem Van de Graaff generator for a predetermined period of time. Any lattice damage resulting in the p-type substrate because of the irradiating is repaired by annealing the substrate by heating it in a furnace.

DESCRIPTION OF THE PREFERRED EMBODIMENT

Figure 1:
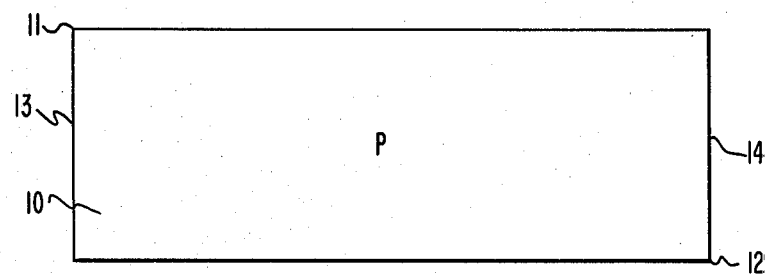
FIGS. 1 through 7 and 9 show steps in a preferred embodiment of the present invention.
Figure 2A:
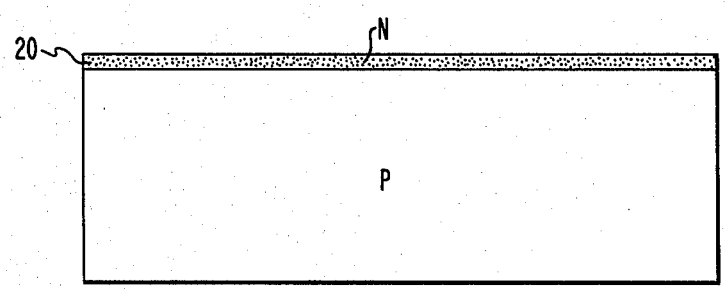
FIGS. 2A and 3A are contrasted with FIGS. 2B and 3B for showing alternative sequences of steps for achieving the same result.

FIGS. 1 through 7 show the steps of a preferred embodiment of the method of the present invention. A substrate 10 of semiconductor material having top and bottom surfaces 11 and 12, respectively, and having a p-type conductivity is shown in FIG. 1. As shown in FIG. 2A, a thin layer of phosphorous ions as shown by the heavily stippled area at 20 approximately 1 $\mu$m-2 $\mu$m thick is formed on the top surface 11 by ion implantation. Phosphorous ions are donor-type ions and therefore the layer 20 is of n-type conductivity. Ion implantation is used in order to control and precisely determine the density of phosphorous atoms in the layer 20 within a narrow range. However, any method by which the density of phosphorous ions can be controlled and precisely determined within a narrow range can be used. In order to achieve the desired ultimate impurity concentration, the ion implantation should be controlled so that the density of the layer 20 is approximately $1 \times 10^{15}$ phosphorous ions/cm$^2$.

Figure 3A:
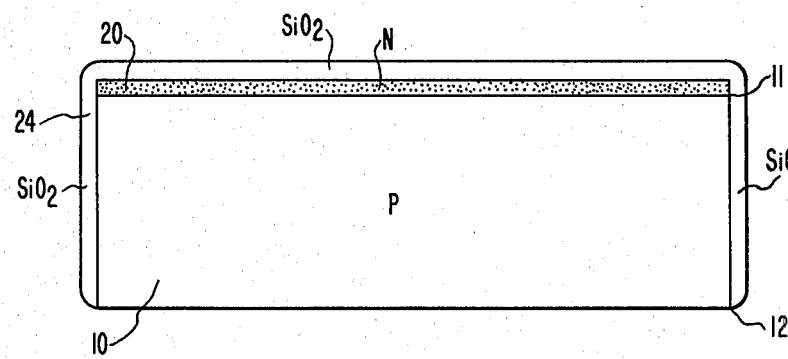
Figure 4:
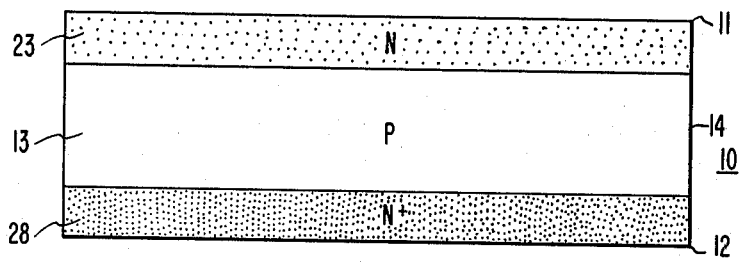
Figure 9:
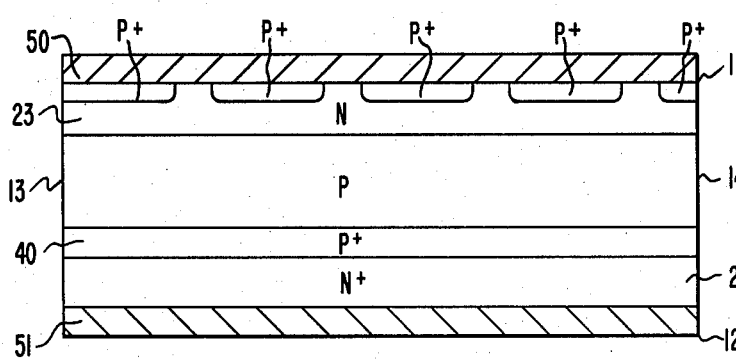

A layer of oxide 24 is deposited over the top surface 11 and the sides 13 and 14 of the substrate 10 resulting in a structure as shown in FIG. 3A. This may be accomplished, of course, by depositing oxide over the entire substrate 10 and then removing it from the surface 12 by a dilute HF etching solution, for example. Next, the substrate 10 is heated in a phosphorous diffusion furnace at a temperature of about 1200° C. for approximately 33 hours. This simultaneously creates a thick n+-type cathode layer 28 on the bottom surface 12 and causes the layer 20 to extend deeper into the substrate 10. The oxide layer 24 prevents the phosphorous in the furnace from diffusing into the layer 20 so as to maintain the precisely determined number of phosphorous ions. Since the same number of phosphorous ions is spread over a greater volume, the density of the layer 20 is lower than the density at the step illustrated by the FIGS. 2A and 3A. The final density of the layer as shown by the lightly stippled area at 23 in FIG. 4 is preferred to be approximately $10^{17}$ phosphorous ions/cm$^3$. Heating the substrate 10 at a temperature of 1200° C. for 33 hours will cause the layer 20 to extend approximately 30 total $\mu$m into the substrate 10. However, any time-temperature combination can be used so long as the layer 20 is caused to extend into the substrate 10 so as to lower the final density of the layer 23 to approximately $10^{17}$ phosphorous ions/cm$^3$. The oxide layer 24 is removed by a dilute HF etching solution and the substrate 10 at the end of this step is shown in FIG. 4. The impurity concentration of the n-type layer 23 is required to be so low, of course, so as to provide a high lateral resistance in order to create a forward voltage sufficient to forward-bias the subsequently formed anode junction and turn-on the subsequently formed complete thyristor (as shown in FIG. 9).

Figure 2B:
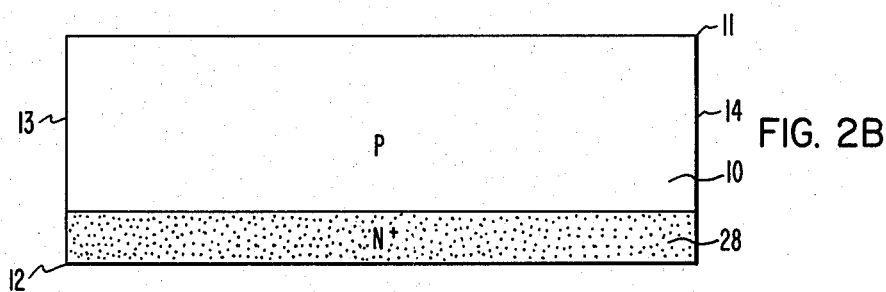
Figure 3B:
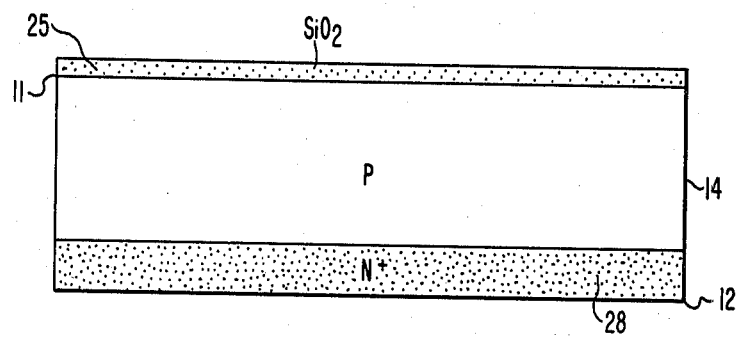

Another method of forming the n-type layers 20 and 28 of FIG. 4 begins with the step of depositing a layer of phosphorous atoms on the bottom surface 12 in order to form the layer 28 as shown in FIG. 2B. A layer 25 of oxide doped with phosphorous ions as shown by the lightly stippled area at 25, is deposited over the top surface 11 as shown in FIG. 3B. Again, this can be done by depositing oxide over the entire substrate 10 and removing it from the sides 13 and 14 and the bottom surface 12 by a dilute HF etching solution. The substrate 10 is then heated in a furnace at a temperature of about 1200° for approximately 33 hours. The concentration of the phosphorous ions in the oxide layer 25 should be controlled and precisely determined within a small range of concentrations such that the phosphorous ions in the oxide diffuse into the substrate 10 through the top surface 11 to a depth of about 30 $\mu$m. The oxide layer 25 is removed by a dilute HF etching solution and the substrate 10 at the end of this step is shown in FIG. 4.

Figure 6:
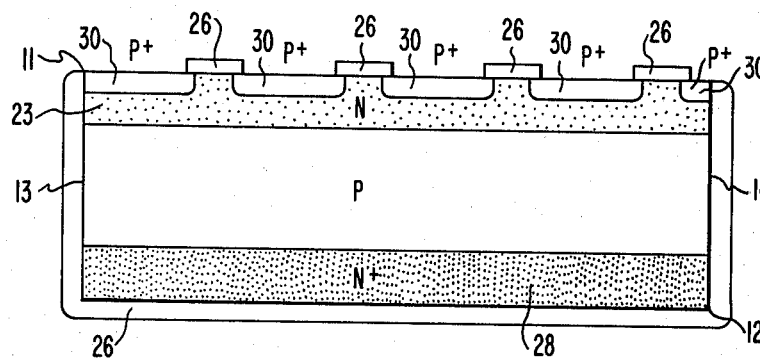
Figure 5:
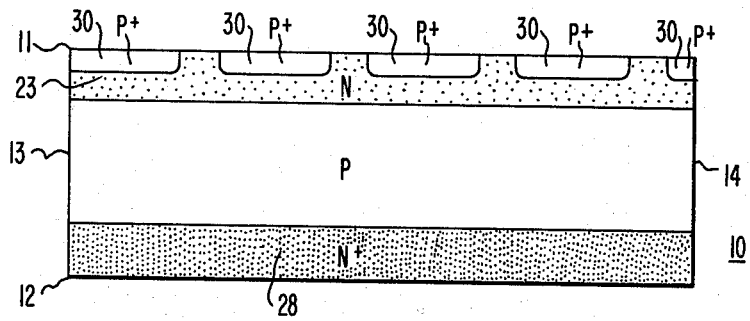

Next, as shown in FIG. 5, a 20 $\mu$m deep p-type region 30 is diffused into the n-type layer 20 in order to form an anode region having an impurity concentration of about $10^{21}$ acceptor atoms/cm$^3$. This can be accomplished by any one of several conventional methods depending upon whether or not a shunted anode configuration is desired. For example, an oxide mask on the surface 11 can be used where anode shunts are desired and no oxide mask is used where no anode shunts are desired. In FIG. 6, for example, a diffusion of boron through an oxide mask 26 can be used to form the region 30. The oxide mask 26 can, as before, be formed by depositing oxide over the entire substrate 10 and removing the oxide, for example, by etching from the sides 13 and 14, the bottom surface 12, and from selected portions of the top surface 11 through an etching mask. The oxide mask 26 is then removed leaving a device such as is shown in FIG. 5.

Figure 7:
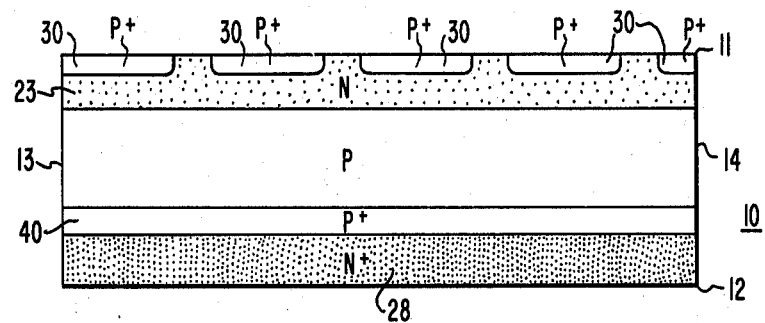

As shown in FIG. 7, a 5-10 $\mu$m thick p+-type impurity layer 40 having an impurity concentration from $5 \times 10^{17}$ acceptor atoms/cm$^3$ to $5 \times 10^{18}$ acceptor atoms/cm$^3$ is formed in the p-type substrate 10 adjacent to the n+-type layer 28. The layer 40 is formed by irradiating the bottom surface 12 for from 20 seconds to 200 seconds with boron ions, for example, from a tandem Van de Graaff generator which can impart to the boron ions a high energy of up to about 36 MeV. At an energy of 36 MeV, the boron atoms will penetrate to approximately 50 $\mu$m which will cause an increased impurity concentration in a 5 $\mu$m thick region adjacent to the 50 $\mu$m thick n+-type layer 28. This increase in impurity concentration will be accompanied by some damage to the silicon lattice in the p-type substrate 10 caused by the penetrating boron atoms, which lattice damage can be annealed out (repaired) by, for example, heating the substrate 10 in a furnace preferably at a temperature of 600° C.–650° C. for a period of 1 hour. Other temperature-time combinations may be used to anneal out the damage, however, so long as the same result is obtained; that is, so long as any lattice damage caused by irradiating the substrate 10 with boron atoms is repaired. For example, increasing the temperature will shorten the period of time required to anneal.

Figure 8:
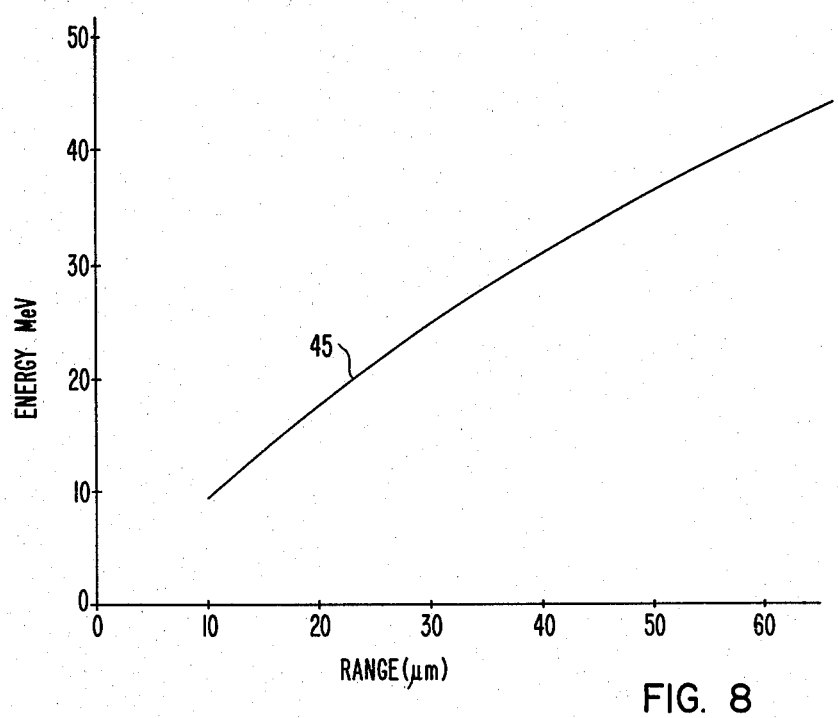
FIG. 8 shows a graph of energy vs. depth of penetration for boron ions bombarding silicon.

Assuming that the n+-type layer 28 is approximately 50 $\mu$m thick, the boron ions should be provided with an energy of about 36 MeV. However, a continuum of depths is possible according to the requirements, that is depending on the thickness of the n+-type layer 28. FIG. 8 shows a curve 45 plotted on a graph having as an ordinate the energy in units of MeV of the boron ions and having as an abscissa the range or depth of penetration of the boron ions in units of $\mu$m. It can be observed that for a penetration of 50 $\mu$m an energy of 36 MeV is required. Other relationships can be determined from the curve 45 in the graph of FIG. 8 as required.

As the boron ions penetrate and travel through the n+-type layer 28, they lose energy primarily by electrical interactions with atomic electrons causing no displacing of silicon atoms in the process until the energy of the boron ions reaches a level of about 0.4 MeV. At this energy level, the primary energy loss is due to displacement (physical) collisions with silicon atoms. That is, atoms are displaced from their lattice position. This displacement damage is the type of damage requiring repair by, for example, annealing.

Each boron ion is provided with an energy within a range $E_o \pm \epsilon$ where $\epsilon$ is a measure of energy spread from a central energy $E_o$. Preferably, $\epsilon = 0$, in which case the p+-layer 40 can be formed having a preferred theoretical minimum thickness as determined by statistical spread in energy. The range of depths to which the ions will penetrate increases as $\epsilon$ increases. The theoretical minimum thickness of the p+-type layer 40 is approximately 5 $\mu$m for a beam of boron ions at an energy of 36 MeV. In addition, the ion beam produced by conventional Van de Graaff accelerators is typically a well-focused one having a diameter on the order of 1 cm. However, the beam can be spread over the surface of a semiconductor wafer such as the substrate 10 by a thin scattering foil or by scanning horizontally and vertically using coils.

The remaining steps for providing a workable semiconductor reverse-conducting thyristor are conventional. As shown in FIG. 9, a 60 mils thick cathode electrode 51 is formed by alloying molybdenum to the silicon by an aluminum solder on the bottom surface 12. Aluminum is evaporated on the top surface 11 for forming a 6 $\mu$m thick anode and the completed device is sintered, bevelled, and passivated.

What we claim is:

1. In a process for preparing a pnpn thyristor in a body of silicon in which the p-type anode emitter region is electrically shorted to the n-type anode base region, the step of;

implanting boron atoms through the n-type cathode emitter whereby a p+ type region is formed between the n-type cathode emitter region and the p-type cathode base region, said p$^{30}$ type region being doped to concentrations of from $5 \times 10^{17}$ to $5 \times 10^{18}$.

2. In the process of claim 1, the additional step of annealing the body of silicon following the ion implantation.

3. In the process of claim 1 wherein the ion implantation is carried out at an energy of about 36 MeV for from 20 to 200 seconds.

4. In the process of claim 3, the additional step of annealing the body of silicon for about one hour at a temperature of from 600° C. to 650° C. following the ion implantation.

\* \* \* \* \*